United States Patent
Peng et al.

(10) Patent No.: US 11,319,485 B2
(45) Date of Patent: May 3, 2022

(54) GROUP III-V QUANTUM DOTS, METHOD FOR PREPARING THE SAME

(71) Applicants: ZHEJIANG UNIVERSITY, Zhejiang (CN); NAJING TECHNOLOGY CORPORATION LIMITED, Zhejiang (CN)

(72) Inventors: Xiaogang Peng, Zhejiang (CN); Yang Li, Zhejiang (CN)

(73) Assignees: Zhejiang University, Zhejiang (CN); Najing Technology Corporation Limited, Zhejiang (CN)

(*) Notice: Subject to any disclaimer, the term of this patent is extended or adjusted under 35 U.S.C. 154(b) by 763 days.

(21) Appl. No.: 16/303,149

(22) PCT Filed: Nov. 1, 2016

(86) PCT No.: PCT/CN2016/104257
§ 371 (c)(1),
(2) Date: Nov. 20, 2018

(87) PCT Pub. No.: WO2017/201967
PCT Pub. Date: Nov. 30, 2017

(65) Prior Publication Data
US 2020/0318002 A1    Oct. 8, 2020

(30) Foreign Application Priority Data
May 24, 2016  (CN) .......................... 201610349306.7

(51) Int. Cl.
| | | |
|---|---|---|
| C09K 11/08 | (2006.01) | |
| C09K 11/74 | (2006.01) | |
| C09K 11/88 | (2006.01) | |
| H01L 51/50 | (2006.01) | |
| C09K 11/70 | (2006.01) | |
| B82Y 20/00 | (2011.01) | |
| B82Y 40/00 | (2011.01) | |

(52) U.S. Cl.
CPC .......... *C09K 11/0883* (2013.01); *C09K 11/70* (2013.01); *C09K 11/7492* (2013.01); *C09K 11/883* (2013.01); *H01L 51/502* (2013.01); *B82Y 20/00* (2013.01); *B82Y 40/00* (2013.01)

(58) Field of Classification Search
CPC .......... C09K 11/00883; C09K 11/7492; B82Y 20/00; B82Y 40/00
See application file for complete search history.

(56) References Cited

U.S. PATENT DOCUMENTS

2015/0076494 A1    3/2015    Pickett et al.
2017/0066050 A1*  3/2017    Kamplain ............... C22C 1/007

FOREIGN PATENT DOCUMENTS

| CN | 1912048 A | 2/2007 |
|---|---|---|
| CN | 1997778 A | 7/2007 |
| CN | 102031110 A | 4/2011 |
| CN | 102031111 A | 4/2011 |
| CN | 103852817 A | 6/2014 |
| CN | 104849904 A | 8/2015 |
| CN | 105051153 A | 11/2015 |
| CN | 106010524 A | 10/2016 |

OTHER PUBLICATIONS

Shu, Xu. etc; Rapid synthesis of highly luminescent InP and InP/ZnS nanocrystals «Journal of Materials Chemistry» May 16, 2008 vol 18. p. 2653-2656.
David Battaglia etc. Formation of High Quality InP and InAs Nanocrystals in a Noncoordinating Solvent «Nano Letters» Aug. 15, 2002 vol 2. p. 1027-1030.
Xiaocheng Jiang etc. InAs/InP Radial Nanowire Heterostructures as High Electron Mobility Devices «Nano Letters» Sep. 15, 2007 vol. p. 3214-3218.
Mee Rahn Kim etc. Fabrication, spectroscopy, and dynamics of highly luminescent core-shell InP@ZnSe quantum dots «Journal of Colloid and Interface Science» Jun. 19, 2010 vol. 350 p. 5-9.

* cited by examiner

*Primary Examiner* — C Melissa Koslow
(74) *Attorney, Agent, or Firm* — Gang Yu

(57) ABSTRACT

This present disclosure provides group III-V quantum dots, method for preparing the same. The preparation method comprises: S1, mixing precursor(s) of group III element, a solvent, a surface activation agent, and seeds of group III-V quantum dots to obtain a mixed system; S2, heating the mixed system to a first temperature; and S3, adding precursor(s) of group V element to the mixed system of the first temperature to obtain group III-V quantum dots, wherein, the seed surface of the group III-V quantum dots has a carboxylate ligand, the surface activation agent is acetylacetone or a derivative of acetylacetone or a compound RCOOH with a carboxyl group, and the first temperature is between 120° C. and 200° C.

10 Claims, 6 Drawing Sheets

GROUP III-V QUANTUM DOTS, METHOD FOR PREPARING THE SAME

CROSS REFERENCE TO RELATED APPLICATIONS

This application is a national application of PCT/CN2016104257, filed on Nov. 1, 2016. The contents of PCT/CN2016104257 are all hereby incorporated by reference.

TECHNICAL FIELD

The disclosure relates to the field of quantum dots materials, in particular to group III-V quantum dots, a method for preparing the same.

BACKGROUND

Quantum dots are widely used in optoelectronic devices due to their narrow and adjustable luminescent properties. Among them, in recent years group III-V quantum dots have become the focus of research and development due to their cadmium-free property. At present, the widely used method for preparing group III-V quantum dots is hot injection, the precursor(s) of group III element and the precursor(s) of group V element are reacting to grow and mature at high temperatures. However, the high activity of tris(trimethylsilyl) phosphine (TMS3P) and the presence of water as an impurity in the Indium carboxylate precursor make it difficult to balance nucleation and growth, thereby, the size distribution of the quantum dots broadens. It can be seen that the hot injection method is suitable for the synthesis of group II-VI quantum dots, but is not applicable to the synthesis of group III-V quantum dots.

In addition, it is also difficult for the hot injection method to generate large-sized group III-V quantum dots. Cossairt et al. synthesized magic-size InP nanoclusters with narrow size distribution using $In(Ac)_3$ and octadecylphosphonic acid, but the reaction temperature was as high as 370 degrees Celsius. Still others tried to reduce the P precursor conversion rate by the structure of the P precursor, but it has recently been confirmed that reducing the precursor conversion rate does not optimize the size distribution.

SUMMARY

This summary is provided to introduce a selection of concepts that are further described below in the detailed description. This summary is not intended to identify key or essential features of the subject matter, nor is it intended to be used as an aid in limiting the scope of the subject matter.

The main objective of the present disclosure is to provide group III-V quantum dots, a method for preparing the same and applications thereof, to solve the problem that it is difficult to obtain the group III-V quantum dots with uniform size distribution using the prior art.

To achieve the aforesaid objective, according to one aspect of the present disclosure, there is provided a method for preparing group III-V quantum dots, the preparation method comprises: S1, mixing precursor(s) of group III element, a solvent, a surface activation agent, and seeds of group III-V Quantum dot to obtain a mixed system; S2, heating the mixed system to a first temperature; and S3, adding precursor(s) of group V element to the mixed system of the first temperature to obtain III-V quantum dots, wherein, the seed surface of the group III-V quantum dots has a carboxylate ligand, the surface activation agent is acetylacetone or a derivative of acetylacetone or a compound RCOOH with a carboxyl group, R in the aforesaid RCOOH is a saturated hydrocarbyl group, the first temperature is between 120° C. and 200° C., and the aforesaid derivative has the following structural formula:

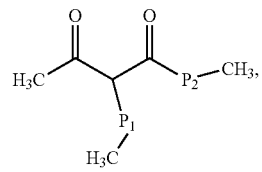

wherein $P_1$ and $P_2$ are each independently selected from the group consisting of an alkyl group, an alkyl group having substituent(s), an alkenyl group, an alkenyl group having substituent(s), and an aryl group.

Further, the aforesaid first temperature is between 140° C. and 180° C.

Further, the aforesaid derivative has the following structural formula

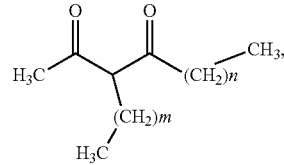

wherein, m is an integer from 1 to 4, and n is an integer from 1 to 4.

Further, R in the aforesaid RCOOH is a saturated hydrocarbyl group with a carbon number ≤6.

Further, the aforesaid RCOOH is selected from at least one of acetic acid, propionic acid and isobutyric acid.

Further, the concentration of the aforesaid surface activation agent in the mixed system is 0.025-0.125 mol/L.

Further, the aforesaid step S3 comprises batchwise adding the precursor(s) of group V element to the mixed system.

Further, the aforesaid precursor of group III element is $A(B)_2C$, $A(C)_3$ or $A(D)_3$, wherein A is a group III element, B is a fatty acid radical with a carbon number ≥8, C is a fatty acid radical with a carbon number ≤6 or $CH_3COCH_2COCH_2-$, and D is a halogen ion.

Further, the aforesaid carboxylate ligand is a carboxylate ligand with a carbon number ≥8.

Further, carboxylate ligand is selected from at least one of octanoate, decanoate, myristate, stearate or oleate.

By applying the technical scheme of the present disclosure, the seeds provide nucleation sites, and the surface activation agent partially replaces the original ligand on the seed surface under thermal disturbance because the binding between the original carboxylate ligand and the seed surface is strong which will impede the binding of free monomer to the seed surface, while the binding between the surface activation agent and the seed surface is weak, that is, the surface activation agent has the ability to switch between the quick crystal surface binding and the nonbinding states, making the free monomer reactants achieve growth on seeds rather than self-nucleation since the energy barrier for self-nucleation is higher than for growth on seeds, thus separating the nucleation and the growth for the benefit of the growth of group III-V quantum dots nanocrystalline. At the same time, the temperature of the aforesaid reaction is controlled above 120° C. and below 200° C., which can effectively prevent the group III element and the group V element from independent nucleation instead of growth on the seed surface to affect the particle size distribution. The temperature of the aforesaid reaction is controlled between 120° C. and 200° C., which can effectively prevent the seeds of group III-V quantum dots from being oxidized on the one hand and reduce the volatilization of the surface activation agent for saving raw materials and being environment friendly on the other hand.

BRIEF DESCRIPTION OF THE DRAWINGS

The accompanying figures, which constitute a part of this application, are used to provide a further understanding of the present disclosure, and the illustrative embodiments of the present disclosure and the description thereof are used to explain the present disclosure, but do not constitute improper limitations to the present disclosure. In the figures.

Figure 6:
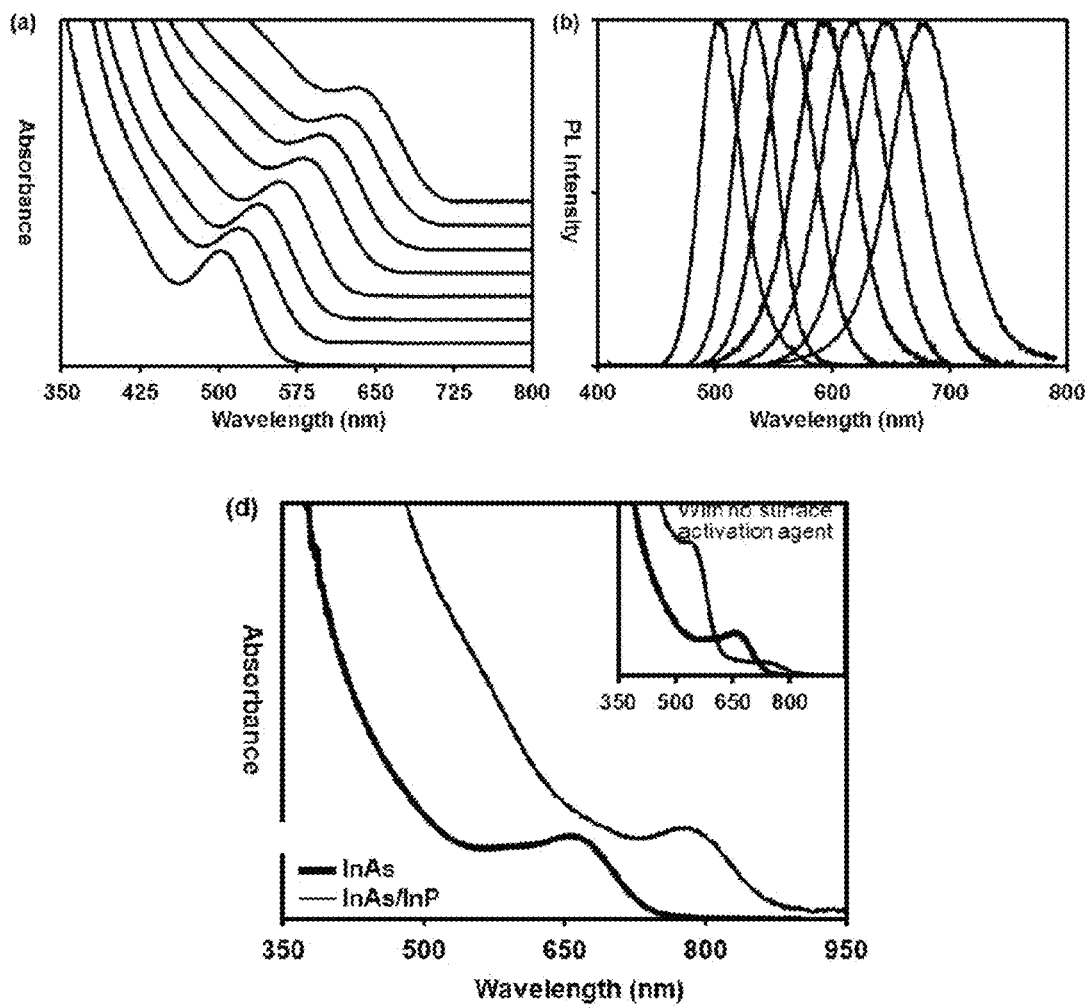
Figure 7:
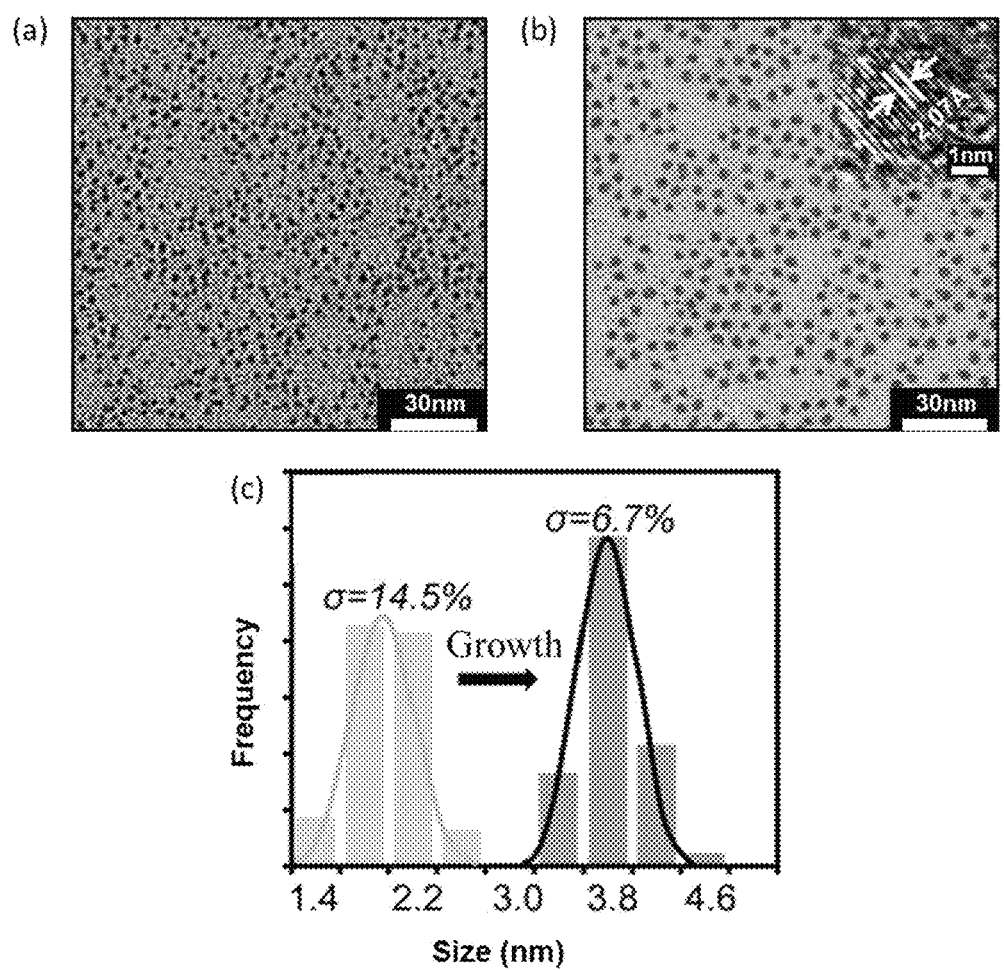

FIG. (a) and (b) of FIG. 6 show the schematic diagrams of the UV absorption spectrum and the fluorescence emission spectrum of core-shell quantum dots of different sizes obtained according to Embodiment 13 of the present disclosure, using an UV-Vis test and a fluorescence spectrometer test, while FIG. (d) of FIG. 6 respectively shows the schematic diagrams of the UV absorption spectrum of InAs quantum dots and InAs/InP quantum dots in the presence or absence of a surface activation agent;

FIG. 7 shows the TEM images of seed prepared in Embodiment 2 and quantum dots obtained by reacting for 20 minutes in Embodiment 1 and the schematic diagram of the particle size distribution of the quantum dots obtained by reacting for 20 minutes In Embodiment 1, wherein (a) is the TEM image of the seeds prepared in Embodiment 2, (b) is the TEM image of the quantum dots obtained by reacting for 20 minutes in Embodiment 1, and (c) is the schematic diagram of the particle size distribution of the quantum dots obtained by reacting for 20 minutes in Embodiment 1.

Figure 8:
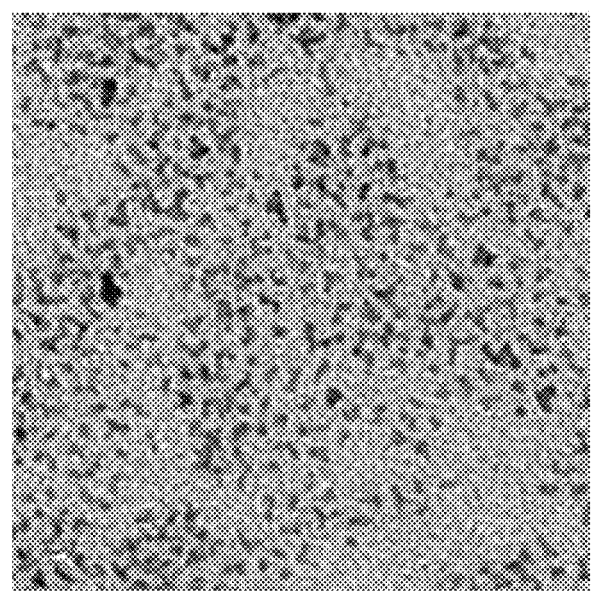
Figure 9:
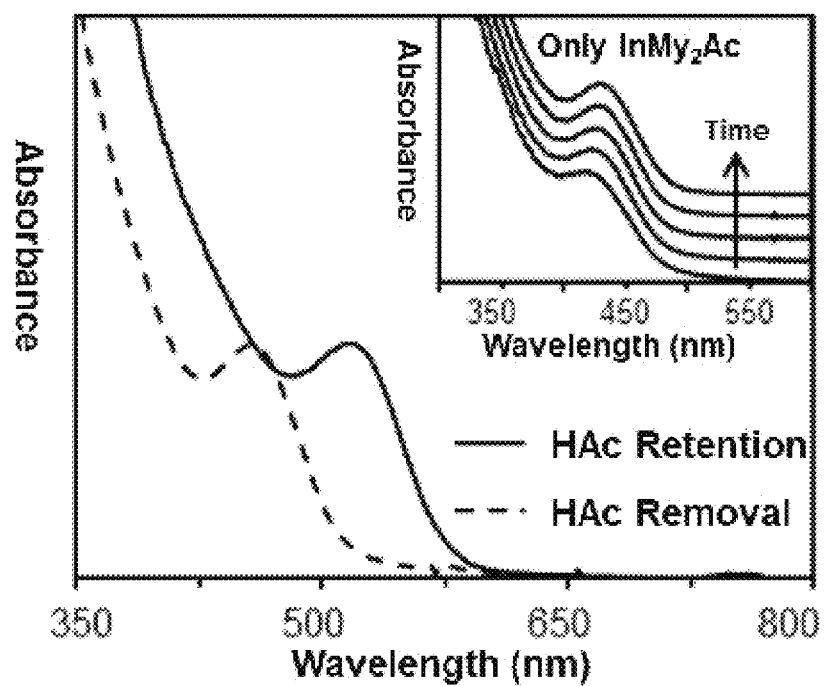

FIG. 8 shows the TEM image of InP quantum dots according to Comparative Embodiment 1 of the present application;

FIG. 9 shows the effect of presence and absence of acetic acid on the synthesized seed size, using an UV-Vis test.

DETAILED DESCRIPTION OF THE EMBODIMENTS

It should be noted that the embodiments in the present application and the features in the embodiments can be combined with each other without conflict. Various aspects and embodiments of the present disclosures will be further described in the following detailed description.

The following preparation methods may have the same requirements for the reaction environment as those in prior art for preparing the quantum dots unless otherwise specified. Prior to the reaction, the moisture and oxygen In the reactor can be removed using an inert gas atmosphere or an air atmosphere in which moisture and oxygen are removed, in some embodiments, the inert gas can be nitrogen, argon or a rare gas.

As described in the background art, the quantum dots in the prior art have a wide size distribution, resulting in lowered performance. Specially, under the condition that the size of each quantum dot in quantum dot population is different, meaning that the photoelectric conversion performance is different, then the application of the quantum dot population is limited. For example, blue light excites one quantum dot to generate red light and another quantum dot to generate green light, however the good situation is, blue light excites each quantum dot, all of them generate a kind of light with the same spectrum.

To solve this problem, the embodiments disclosed herein relate to a method for preparing group III-V quantum dots, the preparation method comprising: S1, mixing precursor(s) of group III element, a solvent, a surface activation agent, and seeds of group III-V Quantum dots to obtain a mixed system; S2, heating the mixed system to a first temperature; and S3, adding precursor(s) of group V element to the mixed system of the first temperature to obtain III-V quantum dots, wherein, the group III-V quantum dots have a carboxylate ligand, the surface activation agent is selected from at least one of acetylacetone, a derivative of acetylacetone and a compound RCOOH with a carboxyl group, R in the aforesaid RCOOH is a saturated hydrocarbyl group, the first temperature is between 120° C. and 200° C., and the aforesaid derivative can have the following structural formula:

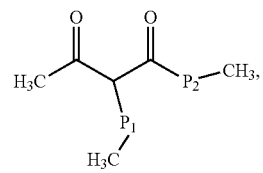

wherein $P_1$ and $P_2$ are each independently selected from the group consisting of an alkyl group, an alkyl group having substituent(s), an alkenyl group, an alkenyl group having substituent(s), and an aryl group.

Since the precursor(s) of group III element, the solvent, the surface activation agent, and the seeds of group III-V quantum dots are not chemically reacted prior to the addition of the precursor(s) of group V element, there is no specific order for addition of the precursor(s) of group III element, the solvent, the surface activation agent, and the seeds of group III-V quantum dots. In one or more embodiments, in order to bring the substances into contact with each other, it is preferable that the precursor(s) of group III element, the solvent and the surface activation agent are first mixed, and then the seeds of group III-V quantum dots are added to obtain the mixed system.

In the aforesaid preparation method, the seeds can provide nucleation sites, and the surface activation agent may partially replaces the original ligand on the seed surface under thermal disturbance because the binding between the original ligand and the seed surface may be strong which will impede the binding of free monomer to the seed surface, while the binding between the surface activation agent and the seed surface is weak, that is, the surface activation agent has the ability to quickly switch between the crystal surface binding state and the nonbinding states, so the free monomer reactants may achieve growth on seeds rather than self-nucleation due to that the energy barrier for self-nucleation is higher than for growth on seeds, thus separating the nucleation and the growth, this is the benefit for the growth of group III-V quantum dots.

After adding the precursor(s) of group V element, the group III and group V elements can grow on the seed surface, and the surface activation agent etches the surface of the grown crystal to achieve the purpose of activation, promoting more group III and group V elements to continuously grow on the crystal surface which may result in crystal growth. Under the condition that the surface activation agent is a compound RCOOH with a carboxyl group, when the surface activation agent loses one proton, the carboxylate ligand of the seeds of the group III-V quantum dots will get a proton and the surface activation agent may become a ligand of group III-V quantum dots. Through such ligand exchange, surface carboxylate ligands and free acids may reach a dynamic equilibrium, and this surface activation can avoid the formation of group III element-O covalent bonds on the surface of group III-V quantum dots, which is good for the growth of group III-V quantum dots with uniform particle size distribution. Under the condition that the surface activation agent is acetylacetone or a derivative of acetylacetone, part of the acetylacetone or the derivative thereof may be converted to the ligand of the acetylacetone or the ligand of the derivative thereof at the aforesaid reaction temperature after the exchange with the carboxylate ligand, meanwhile the absorption of seeds of group III-V quantum dots may be blue shifted by etching the seeds of group III-V quantum dots, the seeds of group III-V quantum dots with bidentate ligands can be obtained. Due to the small steric hindrance of the bidentate ligand, the subsequently added precursor(s) of the group V element can react effectively with the group III precursor(s) in the system, and continue to grow on the seed surface, meanwhile the bidentate ligands may suppress the self-nucleation of group III and group V precursors, thus forming group III-V quantum dots with uniform particle size distribution.

At the same time, the temperature of the aforesaid reaction can be controlled above 120° C., which may effectively prevent the group III element and the group V element from independent nucleation rather than growth on the seed surface, since independent nucleation may affect the particle size distribution. The temperature of the aforesaid reaction can be controlled between 120° C. and 200° C., which can effectively prevent the seeds of group III-V quantum dots from being oxidized, and reduce the volatilization of the surface activation agent from perspectives of saving raw materials and being environment friendly.

Further, in one or more embodiments, $P_1$ may be hydrogen.

In one or more embodiments, the first temperature is between 140° C. and 180° C., which is more conducive to the control of the particle size distribution of the obtained quantum dots.

In one or more embodiments, the aforesaid derivative can has have the following structural formula:

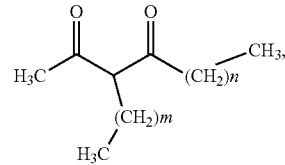

wherein m is an integer from 1 to 4 and n is an integer from 1 to 4;

The particle size of the group III-V quantum dots obtained by the aforesaid preparation method can be controlled by the addition amount of the precursor(s) of the group V element, and preferably, the aforesaid S3 comprises batchwise adding the precursor(s) of the group V element to the mixed system, and the amount and the total number of additions are determined according to the first exciton absorption peak of the III-V quantum dots in the ultraviolet.

In one or more embodiments, the surface activation agent is RCOOH, wherein R can be a saturated hydrocarbyl group with a carbon number ≤6.

In one or more embodiments, RCOOH can be selected from at least one of acetic acid, propionic acid and isobutyric acid. The aforesaid alkyl acids can exchange faster with the ligand of the seeds due to the moderate carbon chain length and the small steric hindrance.

The precursor of the group III element of the present application may be any of $A(B)_2C$, $A(C)_3$ or $A(D)_3$, wherein A is a group III element, B is a fatty acid radical, and C is a fatty acid radical with a carbon number ≤6 or $CH_3COCH_2COCH_2$—, and D is a halogen ion.

In one or more embodiments, the group V precursor may be any of (trimethylsilyl) phosphine ($TMS_3P$), tris(triethylsilyl) phosphine ($TES_3P$) and tris(trimethylsilyl) arsine ($TMS_3As$).

In one or more embodiments, the solvent in step S1 may be a non-coordinating solvent, such as long-chain aliphatic alkane or long-chain aliphatic olefin, preferably tetradecane or octadecene.

In one or more embodiments, the surface activation agent is mainly for providing a group exchanging with the carboxylate ligand of the seeds of group III-V quantum dots, in order to achieve a stable dynamic equilibrium system after the exchange between the two, the surface activation agent concentration in the mixed system can be 0.025 to 0.125 mol/L. Under the condition that the concentration is lower than 0.025 mol/L, the etching effect may be very small, but when the concentration is increased to 0.125 mol/L and continues to increase, it does not bring about an obvious increase in the growth rate. Of course, the reaction also can occur at higher concentrations, but due to no significant increase in the growth rate, the highest concentration is controlled at 0.125 mol/L from the viewpoint of saving raw materials and improving efficiency. In addition, since the reaction of the present application occurs above 120° C., some low-boiling surface activation agents may volatilize to a certain extent, and in order to ensure sufficient surface activation agent during the whole reaction process, the concentration of the surface activation agent may be appropriately increased.

In one or more embodiments, ligand in the synthesis of seeds of group III-V quantum dots, can be a carboxylate ligand having a carbon number ≥8. In one or more embodiments, the carboxylate ligand can have a carbon numbers ≤18. In one or more embodiments, carboxylate ligand is selected from at least one of octoate, decanoate, myristate, stearate and oleate. Since the carboxylate ligand has a large steric hindrance when the carbon chain is long, the carboxylic acid exchanged from quantum dot ligand hinders the continued growth of the quantum dots due to its large steric hindrance, and thus it is not possible to synthesize large-sized quantum dots. When a surface activation agent is added to the system, the seed surface can be activated by first exchanging of the surface carboxylate ligands of the group III-V seeds so that the subsequently added group V precursor(s) can grow uniformly on the seed surface, thus well achieving the synthesis of uniform III-V quantum dots.

The seeds of group III-V quantum dots used in the present application can be produced by a method of synthesizing seeds in the prior art. In one or more embodiments, the seed synthesis method is based on the alkyl amine method, and the alkyl amine is used as a ligand. This method can increase the reactivity of the group III precursor(s) and lower the reaction temperature, thereby inhibiting the indium oxide generation on the seed surface, which is the benefit for the subsequent growth of the monomer reactants on the seed surface. The inventors found that when the Indium precursor is synthesized by $In(Ac)_3$ and myristic acid to form $InMy_2Ac$ during seed synthesis, the reaction also generates acetic acid, and the reaction product system is bubbled with argon for 20 minutes to remove acetic acid and then added with P precursor, leading to a relatively small size of synthesized seed, while if the acetic acid is not removed, the size of synthesized seed is relatively large. When the Indium precursor is a directly prepared $InMy_2Ac$, ie, it is free of acetic acid, the synthesized seed size is relatively small. A comparison of the results is shown in FIG. 9. The redshifted wavelength indicates a larger size. This also demonstrates that acetic acid has surface activation function.

In another aspect, the III-V quantum dots can be prepared by the aforesaid preparation methods. The group III-V quantum dots can have a relative standard deviation (RSD) of the particle size distribution of the group III-V quantum dots ≤10%. Since the particle size distribution of the quantum dots is narrow, the half-peak width of the fluorescence emission spectrum can still be maintained at about 40 nm, and the narrower the full width at half maximum, the sharper the peak shape and the purer the color.

After the aforesaid group III-V quantum dots are obtained, they can be subjected to a shelling treatment to obtain core-shell nanocrystals. Therefore, in another exemplary embodiment, there is also provided a core-shell nanocrystal, the core-shell nanocrystal comprises a core and a shell layer, wherein the core is the aforesaid III-V quantum dots and the shell layer comprises the IIB-VI element or the III-V element. Shelling treatment process can be conducted based on the prior art.

The group III-V quantum dots prepared in the present application have excellent optoelectronic properties because of narrow full width at half maximum and high homogeneity, and can be used In quantum dot composition, suitable for applications such as biological detection, solar energy, display, illumination, etc.; it can be used in quantum dot film as an optical conversion device to improve the color gamut of the display, and can also be used as an electroluminescence substance in the electroluminescent device, replacing the organic luminescent substance in the organic electroluminescent device.

The beneficial effects of the present application will be further described below in conjunction with embodiments and comparative embodiments.

Explanation of the Chemical Substances Involved

Indium acetate ($In(Ac)_3$), 99.99% Indium acetylacetonate ($In(acac)_3$, 98%), basic zinc carbonate ($Zn_5(CO_3)_2(OH)_6$, 97%, Zn>57%), hexanoic acid (HHe, 98%), octanoic acid (98%), decanoic acid (HDe, 99%), myristic acid (HMy, 98%), stearic acid (HSt, 90%), oleic acid (HOl) (90%), octylamine (98%), selenium powder (200 mesh, 99.999%), 1-octadecene (ODE, 90%), n-tetradecane (99%), trioctylphosphine (TOP, 90%) acetylacetone (Hacac, 99+%), 2,4-nonanedione (99+%), acetic acid (Hac, 99±%). Tris (trimethylsilyl) phosphine ($TMS_3P$, 10% by weight in hexane, >98%), tris (triethylsilyl) phosphine ($TES_3P$, 10% by weight in hexane, >98%), tris (trimethylsilyl) arsine ($TMS_3As$, 10% by weight in hexane, >98%) were independently synthesized by NajingTech Co., Ltd. $TMS_3P$, $TES_3P$ and $TMS_3As$ are distilled prior to use and stored in the glove box.

Embodiment 1 Synthesis of InP Quantum Dots

Preparation of the Precursor(s) of Group III Element

Synthesis of $InMy_2Ac$:

5 mmol of $In(Ac)_3$ and 17.5 mmol of HMy were heated under the protection of Ar gas and maintained at 140° C. for 6 hours to obtain a product. The product was washed with acetone three times to remove excess HMy and dried under vacuum overnight to obtain $InMy_2Ac$.

Synthesis of $InDe_2Ac$ and $InSt_2Ac$:

The method is the same as that of $InMy_2Ac$, except that HMy is replaced with HDe or HSt.

Synthesis of $InMy_2acac$:

The method is the same as that of $InMy_2Ac$, except that $In(Ac)_3$ is replaced with $In(acac)_3$.

Preparation of 500 nm Seeds of Group III-V Quantum Dots with My-Ligand

Synthesis of InP Seeds with My-Ligand 0.15 mmol $In(acac)_3$, 0.45 mmol HMy and 3.5 ml ODE were mixed in a 25 ml flask, with 10 minutes of Ar bubbling, and then heated to 185° C. with stirring to obtain the In precursor; A mixture of 0.075 mmol $TMS_3P$ and 0.75 mmol octylamine and ODE (0.8 ml in total) (Ie, the second P precursor) was injected into the In precursor to enable the seed growth at a growth temperature of 178° C. Using the UV-Vs test, when the first exciton peak is around 500 nm, meaning the particles have grown to the desired size, and the heating jacket is then removed to obtain a product system containing InP seeds with My-ligand.

In Situ Purification of InP Seeds:

To an InP seed solution containing a carboxylate ligand at 50° C., 4 ml of hexane and 8 ml of methanol were added and stirred for 2.5 minutes. Leave it, and after stratification, the lower colorless solution was separated with a syringe to retain the upper hexane/ODE phase. Then, the hexane/ODE phase was bubbled with Ar gas at 70° C. to obtain InP seeds with My-ligand. Note: The hexane and methanol are bubbled with Ar prior to use to remove oxygen and then placed in a molecular sieve for storage.

Synthesis of 500 nm InP seeds with De- or St-ligand: The synthesis method is the same as that of the InP seeds with My-ligand, except that HMy is replaced with HDe or HSt.

Synthesis of InP Quantum Dots

Figure 1:
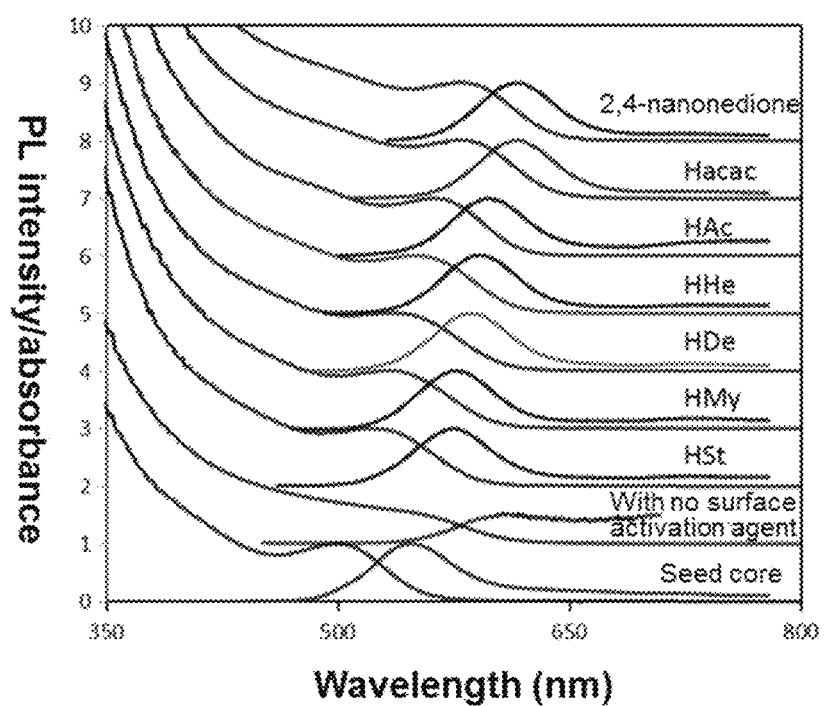
FIG. 1 shows the UV-Visible absorption and emission peaks of the InP quantum dots obtained by different surface activation agent treatments and no surface activation agent treatment according to Embodiments 1, 5 to 10 of the present disclosure, using an UV-Vis test, wherein, the long lines represent UV-Visible absorption peak, and the short lines represent UV-Visible emission peak.
Figure 2:
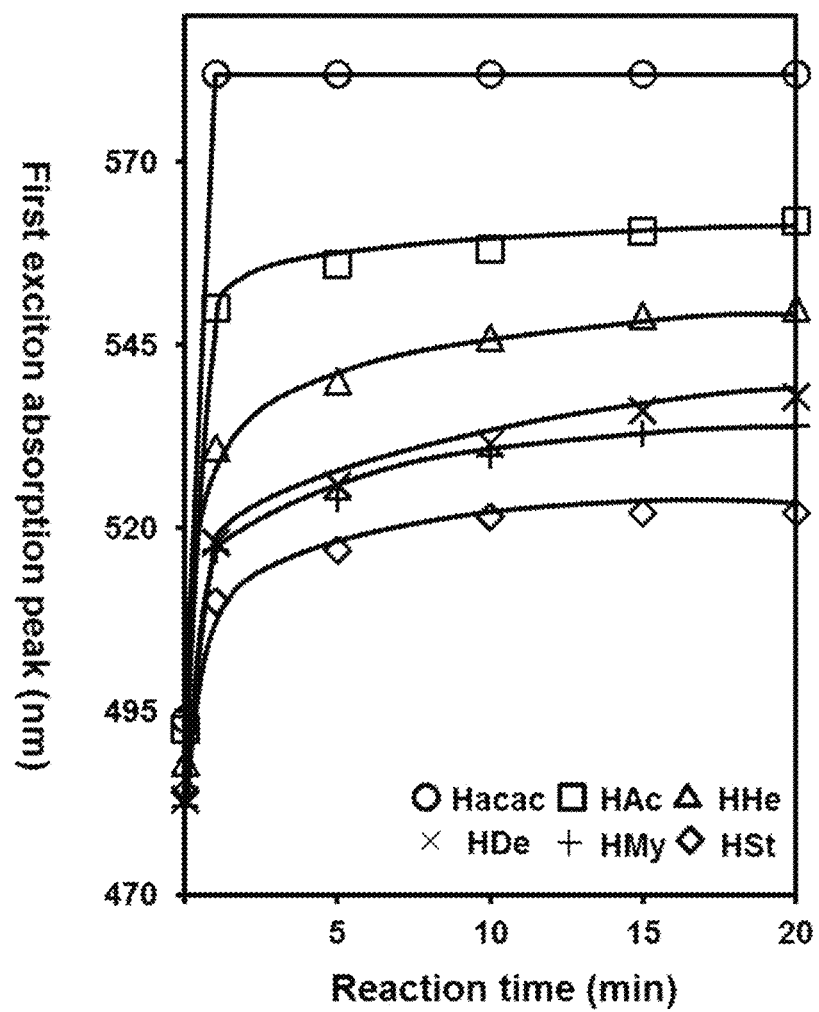
FIG. 2 shows the schematic diagram of the first exciton peak of the InP quantum dots obtained as the reaction progresses based on different surface activation agent treatments according to Embodiments 1 and 5 to 10 of the present disclosure, using an UV-Vis test.

A mixture of 0.15 mmol of $InMy_2Ac$ and 2.5 ml of tetradecane was placed in a 25 ml flask. After bubbling the mixed solution with Ar gas for 10 min, 0.3 mmol of Hacac was injected into the mixture to obtain an initial mixed system, and the initial mixed system was heated to 160° C. to obtain an initial hot mixed system. Adding $2 \times 10-7$ mol of InP seeds with My-ligand (about 1.5 ml) to the initial hot mixed system to obtain a mixed system (the concentration of surface activation agent Hacac in the mixed system is 0.075 mol/L). The mixed system was heated to 160° C. to obtain a hot mixed system. A mixture of 0.05 mmol of TMS3P and 0.5 ml of ODE was injected into the hot mixed system at a rate of 0.05 ml/min, and the reaction was maintained at 160° C. for 20 min. The emission peaks of InP quantum dots obtained at different reaction times were detected by UV-Vis test, and the specific test results are shown in FIG. 1 and FIG. 2. Dropwise add $TMS_3P$ multiple times as required, and stop dropping when the UV absorption peak reaches the target wavelength. InP quantum dots spectra corresponding to different wavelengths are shown in FIG. 6(a). Ligand densities before and after the exchange of surface ligand of quantum dots are shown in Table 1.

Embodiment 2 Synthesis of InP/ZnSe Core-Shell Quantum Dots

Synthesis of Zinc Oleate $(Zn(Ol)_2)$:

1 mmol of $Zn_5(CO_3)_2(OH)_6$ and 11 mmol of HOl were mixed in a flask and heated to 200° C. in an Ar atmosphere to form a clear solution, which was then kept stirring for 1 hour. After 1 hour, the solution was cooled to room temperature and precipitated with acetone. The resulting precipitate was washed three times with acetone and dried under vacuum overnight.

Preparation of Se Precursor:

Preparation of 0.2 mM TOPSe solution: 2 mmol of Se powder and 5 mmol of TOP were then mixed with 6.13 g of ODE in a glove box.

The system obtained In Embodiment 1 containing the InP quantum dots with different wavelengths was cooled down to 150° C., and 0.2 mmol of octanoic acid was injected into the system. After 5 minutes, a certain amount of zinc oleate ODE solution (0.2 mM) was added to the system, after the temperature rising to 260° C., and then the TOPSe solution equivalent to zinc oleate is added and the reaction is maintained for 30 minutes. At the same time, fluorescence emission spectra of InP/ZnSe quantum dots obtained after 30 min of reaction were detected by PL spectroscopy, and the specific detection results are shown in FIG. 6(b).

Embodiment 3 Synthesis of InP Quantum Dots

Synthesis of 650 nm InAs Seeds with My-Ligand 0.15 mmol $In(Ac)_3$, 0.45 mmol HMy and 3.5 ml ODE were mixed in a 25 ml flask with 30 minutes of Ar gas bubbling at 150° C. to obtain the In precursor; With the temperature of the In precursor raised to 240° C., 0.01875 mmol $TMS_3As$ in ODE (0.8 ml) was injected, and the reaction temperature was set at 230° C. Using the UV-Vis test, when the first exciton peak is around 650 nm, the particle grows to the desired size, and the heating jacket is removed to obtain a product system containing InAs seeds with My-ligand.

In-situ purification of InAs seeds: The procedure was the same as that of Embodiment 2, except that 0.15 ml of oleylamine was added after addition of methanol for the first time purification. For the second time purification, only hexane and methanol were added.

Synthesis of InAs Quantum Dots

A mixture of 0.15 mmol of $InDe_2Ac$ and 2.5 ml of tetradecane was placed in a 25 ml flask. After bubbling the mixed solution with Ar gas for 10 minutes, 0.3 mmol of HAc was injected into the mixture to obtain an initial mixed system, and the initial mixed system was heated to 160° C. to obtain an initial hot mixed system. Add 2×10-mol of purified InAs seeds with My-ligand (about 1.0 ml) to the initial hot mixed system to obtain a mixed system (the concentration of surface activation agent HAc in the mixed system is 0.075 mol/L). The mixed system was heated to 160° C. to obtain a hot mixed system. Dropwise add a mixture of 0.015 mmol of $TMS_3As$ in ODE (1.0 ml ODE) into the hot mixed system at a rate of 0.025 ml/min, and the reaction was maintained for 20 minutes. At the same time, the absorption peaks of InAs quantum dots obtained after 20 minutes of reaction were detected by UV-Vis test, and the specific detection results are shown in FIG. 6(d).

Embodiment 4 Synthesis of InAs/InP Core-Shell Quantum Dots

A mixture of 0.15 mmol of InDe2Ac and 2.5 ml of tetradecane was placed in a 25 ml flask. After bubbling the mixed solution with Ar gas for 10 minutes, 0.3 mmol of HAc was injected into the mixture to obtain an initial mixed system, and the initial mixed system was heated to 160° C. to obtain an initial hot mixed system. Add $2 \times 10^{-7}$ mol of InAs seeds with My-ligand (about 1.0 ml) purified according to Embodiment 3 to the initial hot mixed system to obtain a mixed system (the concentration of surface activation agent HAc in the mixed system is 0.075 mol/L). The mixed system was heated to 160° C. to obtain a hot mixed system. Dropwise add a mixture of 0.05 mmol of TMS3P in ODE (1.0 ml ODE) Into the hot mixed system at a rate of 0.05 ml/min, and the reaction was maintained for 20 minutes to grow the InP shell. At the same time, the absorption peaks of InAs/InP core-shell quantum dots obtained after 20 minutes of reaction were detected by UV-Vis test, and the specific detection results are shown in FIG. 6(d).

Embodiments 5 to 10 Synthesis of InP Quantum Dots with Different Surface Activation Agents The synthesis method was the same as that of Embodiment 1, except that Hacac was sequentially replaced with HAc, HHe, HDe, HMy and HSt, 2,4-decanedione. At the same time, the UV-Vis test was used to detect the emission peak of InP quantum dots obtained after 20 minutes of reaction, and the specific detection results are shown in FIG. 1. UV-Vis test was used to detect the emission peaks of InP quantum dots obtained at different reaction times, and the specific detection results are shown in FIG. 2 where the results of 2,4-nonanedione and Hacac coincide.

Figure 3:
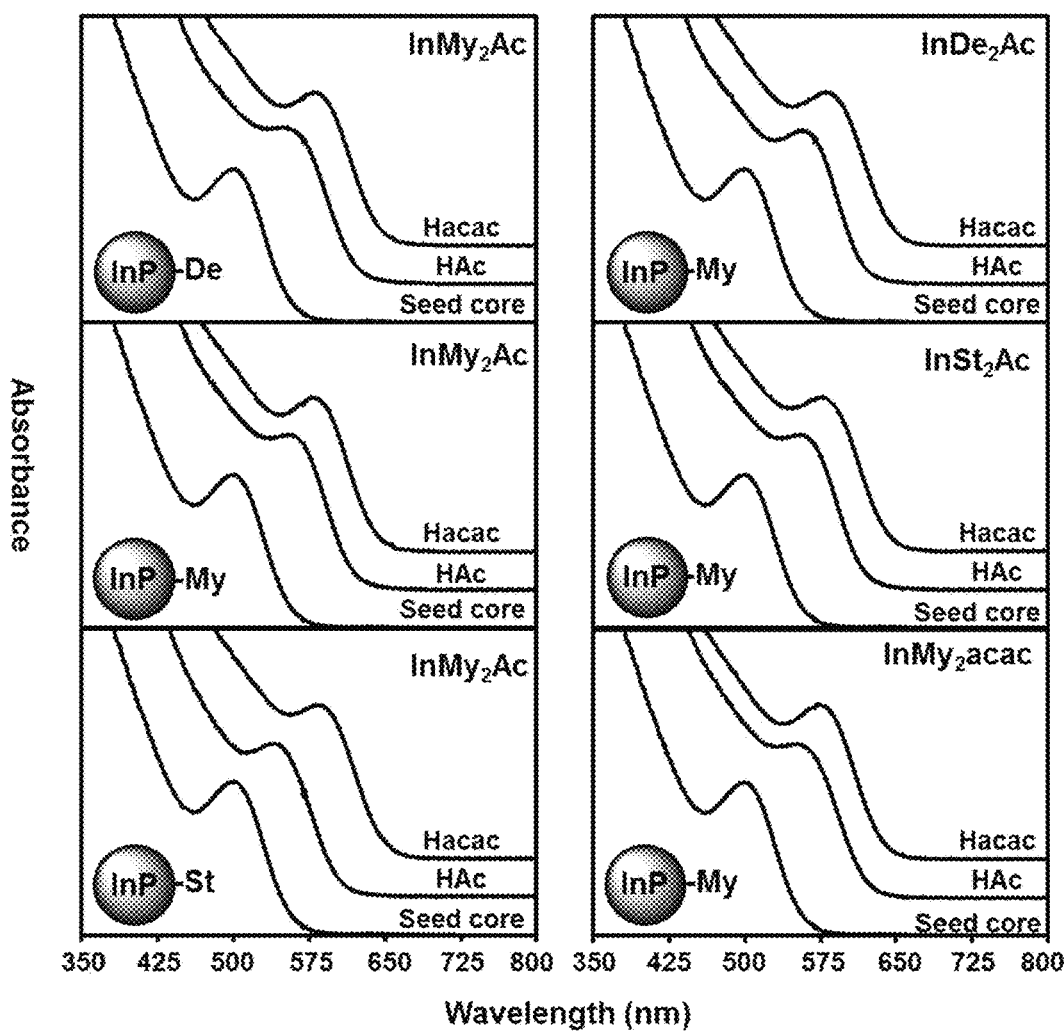
FIG. 3 shows the schematic diagram of UV absorption of the InP quantum dots obtained by different In precursors and ligands according to Embodiments 1, 11 to 13, 23, and 24 of the present disclosure, using an UV-Vis test.

Embodiments 11 to 13 Synthesis of Hacac-Activated InP Quantum Dots with Different in Precursors The synthesis method was the same as that of Embodiment 1, except that the $InMy_2Ac$ precursor was sequentially replaced with $InDe_2Ac$, $InSt_2Ac$, and $InMy_2acac$. At the same time, the UV-Vis test was used to detect the emission peaks of the InP quantum dots obtained after 20 minutes of reaction, and the specific detection results are shown in FIG. 3.

Embodiments 14 to 19 Different Reaction Temperatures

Figure 4:
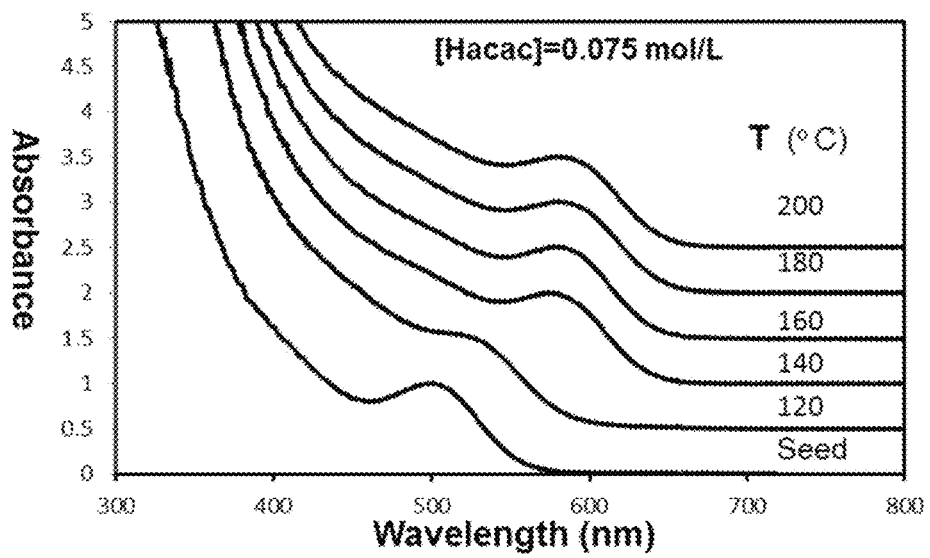
FIG. 4 shows the schematic diagram of UV absorption of the InP quantum dots obtained at different temperatures according to Embodiments 1, 14 to 19 of the present disclosure, using an UV-Vis test.

The synthesis method was the same as in Embodiment 1, and the reaction temperature was sequentially 120° C., 140° C., 180° C., and 200° C., and at the same time, the UV-Vis test was used to detect the emission peaks of the InP quantum dots obtained after 20 minutes of reaction, and the specific detection results are shown in FIG. 4.

Embodiments 20 to 22 Surface Activation Agents at Different Concentrations

Figure 5:
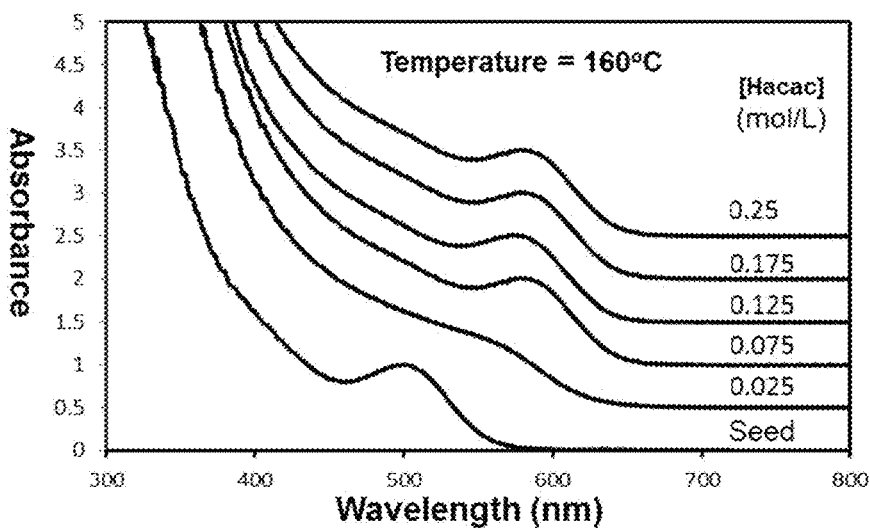
FIG. 5 shows the schematic diagram of UV absorption of the InP quantum dots obtained at different surface activation agent concentrations according to Embodiments 1, 20 to 22 of the present disclosure, using an UV-Vis test.

The synthesis method was the same as that of Embodiment 1. The concentration of the surface activation agent Hacac in the mixed system was sequentially 0.025 mol/L, 0.075 mol/L, and 0.125 mol/L, and at the same time, the UV-Vis test was used to detect the emission peaks of the InP quantum dots obtained after 20 minutes of reaction, and the specific detection results are shown In FIG. 5.

Embodiments 23 to 24 Seeds with Different Carboxylate Ligands

The synthesis method was the same as that of Embodiment 1, except that the seeds were replaced with 500 nm InP seeds with De-ligand and 500 nm InP seeds with St-ligand, and at the same time, the UV-Vis test was used to detect the emission peaks of the InP quantum dots obtained after 20 minutes of reaction, and the specific detection results are shown in FIG. 3.

Comparative Embodiment 1

In the same manner as in Embodiment 1, except that no seed surface activation agent was added, the quantum dots of Comparative Embodiment 1 were obtained.

The seeds of Embodiment 2 and Embodiment 3 were reacted for 20 minutes to obtain InP quantum dots whose size was measured by X-ray diffractometry (XRD). The instrument was a Science Ultimate-IV X-ray diffractometer, and the test conditions were 40 kV/40 mA and Cu Kα radiation (λ=1.5418 Å). The quantum dots were centrifuged with acetone and placed on a glass substrate for testing and the test results are shown in FIG. 7.

The seeds prepared according to Embodiment 2 and Embodiment 1 vs Comparative Embodiment 1 were reacted for 20 minutes to obtain quantum dots which are detected by TEM, with the detection results shown in FIG. 7 and FIG. 8.

TABLE 1

| Quantum dots | C % | H % | N % | $N_{My-}$ (nm$^{-2}$) | $N_{amine}$ (nm$^{-2}$) | $N_{acac-}$ (nm$^{-2}$) |
|---|---|---|---|---|---|---|
| Initial seeds | 43.16 | 7.05 | 0.2 | 6.9 | 0.4 | 0 |
| Quantum dots activated by Hacac | 34.86 | 5.35 | 0 | 4.1 | 0 | 1.6 |

As can be seen from Table 1, after ligand exchange, the types of ligands on the surface of quantum dots and the number of ligands per square nanometer have changed, and the mass fractions of C, H, and N elements also prove this phenomenon.

As can be seen from FIG. 1, after adopting the method of the present application, the seed grows significantly, and under the same reaction condition, when the surface activation agent is RCOOH, the particle size of the obtained quantum dots is relatively large for the carbon number of R≤6 and increases when the carbon number of R>6; when the surface activation agent is acetylacetone, the particle size of the quantum dots is relatively large, indicating that RCOOH has surface activation function.

As can be seen from FIG. 2, with the increase of the reaction time, the seed gradually grows, and the particle size of the quantum dots tends to be constant and does not increase significantly after the reaction time is extended to 20 minutes.

As can be seen from FIG. 3, in the presence of InP seeds with different long-chain fatty acid Ligands, with different fatty acid salts as the group III precursors and acetic acid or acetylacetone as the surface activation agent, InP quantum dots of corresponding size can be prepared, demonstrated by the changes in the UV absorption spectrum.

As can be seen from FIG. 4, when the reaction temperature is 120° C., the seed grows instantly; however, when the reaction temperature continues to increase, the growth of the seed is not obvious, and at four temperatures of 140° C., 160° C., 180° C. and 200° C., when the group III precursor is added in equal amounts, the UV absorption peaks did not undergo a red shift, indicating that the final size of quantum dots was the same and the growth rate was the same, so there is no effect on the growth rate and the final size when the temperature rises above 140° C.

As can be seen from FIG. 5, when the concentration of the surface activation agent is 0.025 mol/L, the seed growth can be found, but when the concentration is increased to 0.075 mol/L, the continued increase in concentration did not bring about an increase in size.

As can be seen from FIG. 6, (a) shows the UV absorption spectrum of InP quantum dots with an first exciton absorption peak in UV of 500-650 nm, and (b) shows the photoluminescence (PL) spectrum of an InP/ZnSe quantum dots with an emission peak of 500-700 nm, and (d) shows the UV absorption spectra of InAs and InP grown with or without surface activation agent.

As can be seen from FIG. 7, (a) is a TEM image of InP seeds, with the size of 1.97 nm and the RSD of about 14.5%, (b) is a TEM image showing the grown-up InP seeds with the size of 3.84 nm and the RSD of about 6.7%, (c) shows that the standard deviation of the particle size is 6.7% to reach the level of normal group II-VI quantum dots, indicating that the particle size distribution of the group III-V quantum dots obtained In the present application is narrow.

As can be seen from FIG. 8, the shape of the quantum dots obtained In Comparative Embodiment 1 was not uniform, and continued addition of the precursor(s) of group V element cannot enable the growth of quantum dots.

As can be seen from FIG. 9, the presence of HAc can make the seed size larger, indicating that HAc has the effects of surface activation function.

From the aforesaid description, it can be seen that the aforesaid embodiments of the present disclosure achieve the following technical effects:

In the aforesaid preparation method, the seeds provide nucleation sites, and the surface activation agent partially replaces the original ligand on the seed surface under thermal disturbance because the binding between the original ligand and the seed surface is strong which will impede the binding of free monomer to the seed surface, while the binding between the surface activation agent and the seed surface is weak, that is, the surface activation agent has the ability to switch between the quick crystal surface binding and the nonbinding states, making the free monomer reactants achieve growth on seeds rather than self-nucleation since the energy barrier for self-nucleation is higher than for growth on seeds, thus separating the nucleation stage and the growth stage for the benefit of the growth of group III-V quantum dots.

After adding the precursor(s) of group V element, the group III and group V elements grow on the seed surface, and the surface activation agent etches the surface of the grown crystal to achieve the purpose of activation, prompting more group III and group V elements to continue to grow on the crystal surface to achieve crystal growth. Under the condition that the surface activation agent is a compound RCOOH with a carboxyl group, when the surface activation agent loses one proton, the carboxylate ligand of the seeds of the group III-V quantum dots will get a proton and the surface activation agent becomes a ligand of group III-V quantum dots. Through this ligand exchange, surface carboxylate ligands and free acids reach a dynamic equilibrium, and this surface activation can avoid the formation of group III element-O bonds on the surface of group III-V quantum dots for the benefit of the growth of group III-V quantum dots on the seed surface to form group III-V quantum dots with uniform particle size distribution. Under the condition that the surface activation agent is acetylacetone and a derivative thereof, part of the acetylacetone and the derivative thereof are converted to the ligand of the acetylacetone and the derivative thereof at the aforesaid reaction temperature, completing the exchange with the carboxylate ligand to make the absorption of seeds of group III-V quantum dots undergoes blue shifting to achieve the purpose of etching the seeds of group III-V quantum dots and obtain the seeds of the bidentate group III-V quantum dots, and then, due to the small steric hindrance of the bidentate ligand, the subsequently added precursor(s) of the group V element can react effectively with the group III precursor(s) in the system, continue to grow on the seed surface, and suppress the self-nucleation of group III and group V precursors, thus forming group III-V quantum dots with uniform particle size distribution.

At the same time, the temperature of the aforesaid reaction is controlled between 120° C. and 200° C., which may effectively prevent the seeds of group III-V quantum dots from being oxidized on the one hand and reduce the volatilization of the surface activation agent for saving raw materials and being environment friendly on the other hand.

The foregoing descriptions are merely some embodiments of the present disclosure and are not intended to limit the present disclosure, and for those skilled in the art, the present disclosure may have various changes and modifications. Any modification, equivalent replacement, and improvement made In the spirit and principle of the present disclosure shall fall within the protection scope of the present disclosure.

What is claimed is:

1. A preparation method of group III-V quantum dots, wherein said preparation method comprises:
S1, mixing precursor(s) of group III element, a solvent, a surface activation agent, and seeds of group III-V quantum dots to obtain a mixed system;
S2, heating the mixed system to a first temperature; and
S3, adding precursor(s) of group V element to the mixed system of the first temperature to obtain group III-V quantum dots,
wherein said seeds of group III-V quantum dots have a carboxylate ligand, said surface activation agent is selected from at least one of acetylacetone, a derivative of acetylacetone and a compound RCOOH with a carboxyl group, R is RCOOH is a saturated hydrocarbyl group, said first temperature is between 120° C. and 200° C., and said derivative has the following structural formula:

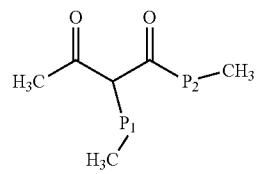

$P_1$ and $P_2$ are each independently selected from the group consisting of an alkyl group, an alkyl group having substituent(s), an alkenyl group, an alkenyl group having substituent(s), and an aryl group.

2. The preparation method according to claim 1, wherein said first temperature is between 140° C. and 180° C.

3. The preparation method according to claim 1, wherein said derivative has the following structural formula:

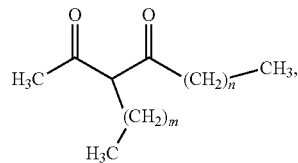

m is an integer from 1 to 4, and n is an integer from 1 to 4.

4. The preparation method according to claim 1, wherein R in said RCOOH is a saturated hydrocarbyl group with a carbon number $\leq 6$.

5. The preparation method according to claim 4, wherein said RCOOH is selected from at least one of acetic acid, propionic acid and isobutyric acid.

6. The preparation method according to claim 1, wherein the concentration of said surface activation agent in said mixed system is 0.025-0.125 mol/L.

7. The preparation method according to claim 1, characterized in that said step S3 comprises batchwise adding said precursor(s) of group V element to said mixed system.

8. The preparation method according to claim 1, wherein said precursor(s) of group III element is $A(B)_2C$, $A(C)_3$ or $A(D)_3$, wherein A is a group III element, B is a fatty acid radical with a carbon number $\geq 8$, C is a fatty acid radical with a carbon number $\leq 6$ or $CH_3COCH_2COCH_2—$, and D is a halogen ion.

9. The preparation method according to claim 1, wherein said carboxylate ligand is a carboxylate ligand with a carbon number $\geq 8$.

10. The preparation method according to claim 1, wherein said carboxylate ligand is selected from at least one of octanoate, decanoate, myristate, stearate and oleate.

* * * * *